(12) United States Patent
Cheng et al.

(10) Patent No.: US 8,193,454 B2
(45) Date of Patent: Jun. 5, 2012

(54) CIRCUIT SUBSTRATE HAVING POWER/GROUND PLANE WITH GRID HOLES

(75) Inventors: Hung-Hsiang Cheng, Kaohsiung (TW); Chih-Yi Huang, Kaohsiung (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 272 days.

(21) Appl. No.: 12/583,804

(22) Filed: Aug. 26, 2009

(65) Prior Publication Data
US 2010/0051341 A1    Mar. 4, 2010

(30) Foreign Application Priority Data
Aug. 27, 2008    (TW) .............................. 97132717 A

(51) Int. Cl.
*H05K 1/03*    (2006.01)
(52) U.S. Cl. ...................... 174/255; 174/260; 174/262

(58) Field of Classification Search ........................ None
See application file for complete search history.

(56) References Cited

U.S. PATENT DOCUMENTS

| | | | |
|---|---|---|---|
| 6,184,478 B1 * | 2/2001 | Imano et al. .................. | 174/261 |
| 6,380,633 B1 * | 4/2002 | Tsai .............................. | 257/778 |
| 6,534,852 B1 * | 3/2003 | Lin et al. ...................... | 257/691 |
| 2005/0082086 A1 * | 4/2005 | Lin et al. ...................... | 174/250 |

* cited by examiner

*Primary Examiner* — Ishwarbhai Patel
(74) *Attorney, Agent, or Firm* — McCracken & Frank LLC

(57) ABSTRACT

The present invention relates to a circuit substrate having a first conductive layer. The first conductive layer includes at least one power/ground plane. The power/ground plane includes at least one plane edge and plurality of grid lines. Each grid line has a width. The grid lines intersect each other to define a plurality of first grid holes, wherein the distance between the first grid hole that is closest to the plane edge and the plane edge is 1.5 times the width. Thus, the influence on the resistance of power signal and ground signal caused by the first grid holes is reduced, power integrity is improved, and heat generation is reduced.

10 Claims, 4 Drawing Sheets

CIRCUIT SUBSTRATE HAVING POWER/GROUND PLANE WITH GRID HOLES

BACKGROUND OF THE INVENTION

1. Field of the Invention

The present invention relates to a circuit substrate, and more particularly to a circuit substrate having a power/ground plane with grid holes.

2. Description of the Related Art

FIG. 1 shows a top view of a conventional circuit substrate. The conventional circuit substrate 1 is a substrate for window ball grid array (WBGA) package, which comprises a window 11, a plurality of power/ground planes 12, a plurality of fingers 13, a plurality of I/O ball pads 14, a plurality of power/ground ball pads 15 and a plurality of conductive traces 16. The fingers 13 are disposed at the periphery of the window 11. Each power/ground plane 12 has a plurality of grid lines 121, and the grid lines 121 intersect each other to define a plurality of grid holes 122. The material of the power/ground planes 12 is copper, and the grid lines 121 and the grid holes 122 are formed by etching a large area made of copper. For reliability, the grid lines 121 and the grid holes 122 are evenly distributed, so as to increase air dissipation and the bonding strength between two laminated layers.

The I/O ball pads 14 are electrically connected to some of the fingers 13 by some of the conductive traces 16. The power/ground ball pads 15 are disposed on the power/ground planes 12, and the power/ground planes 12 are electrically connected to the other fingers 13 by the other conductive traces 16. The fingers 13 are electrically connected to a chip (not shown), and a plurality of solder balls (not shown) are formed on the I/O ball pads 14 and the power/ground ball pads 15.

The disadvantage of the conventional circuit substrate 1 is described as follows. Since the power/ground plane 12 is an important source of power signal and ground signal, the grid holes 122 disposed thereon will influence the resistance of power signal and ground signal, thereby reducing power integrity.

Therefore, it is necessary to provide a circuit substrate having a power/ground plane with grid holes to solve the above problem.

SUMMARY OF THE INVENTION

The present invention is directed to a circuit substrate having at least one power/ground plane. The power/ground plane has at least one plane edge and a plurality of grid lines. Each grid line has a width. The grid lines intersect each other to define a plurality of first grid holes, and the distance between the first grid hole that is closest to the plane edge and the plane edge is more than 1.5 times the width. The first conductive layer also includes a window. The invention further includes a second conductive layer that is disposed under the first conductive layer. The second conductive layer also includes a window, as well as a plurality of second grid holes and a projection layout. The projection layout is a region formed by projecting the layout of the first conductive layer onto the second conductive layer. The second grid holes are disposed outside the projection layout, and the window of the second conductive layer corresponds to the window of the first conductive layer. The invention also includes a dielectric layer disposed between the first conductive layer and the second conductive layer. The dielectric layer has a thickness that is less than the distance between the second grid hole of the second conductive layer that is closest to the projection layout. Thus, the influence on the resistance of power signal and ground signal caused by the first grid holes is reduced, power integrity is improved, and heat generation is reduced.

DETAILED DESCRIPTION OF THE INVENTION

Figure 1:
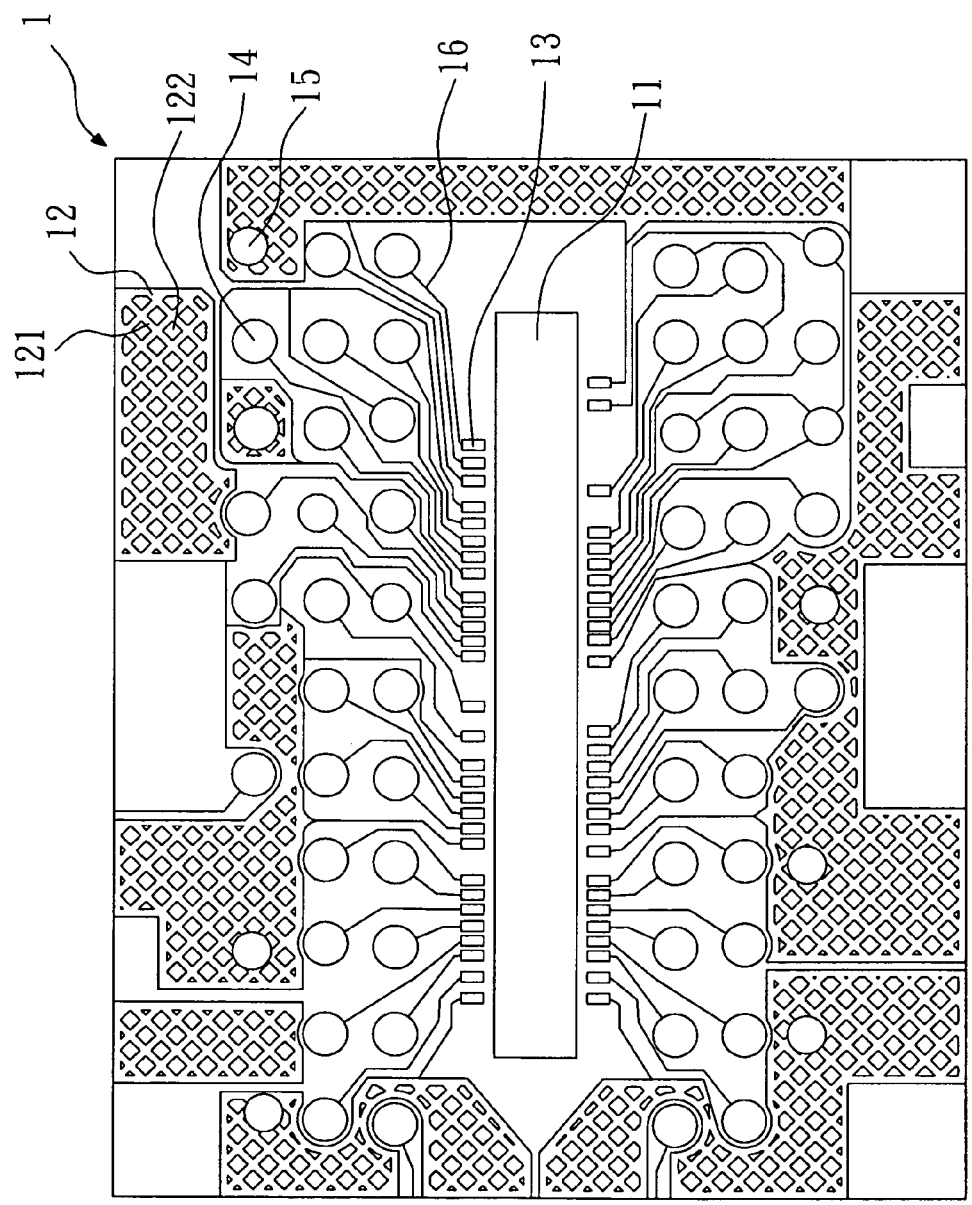
FIG. 1 is a top view of a conventional circuit substrate.
Figure 2:
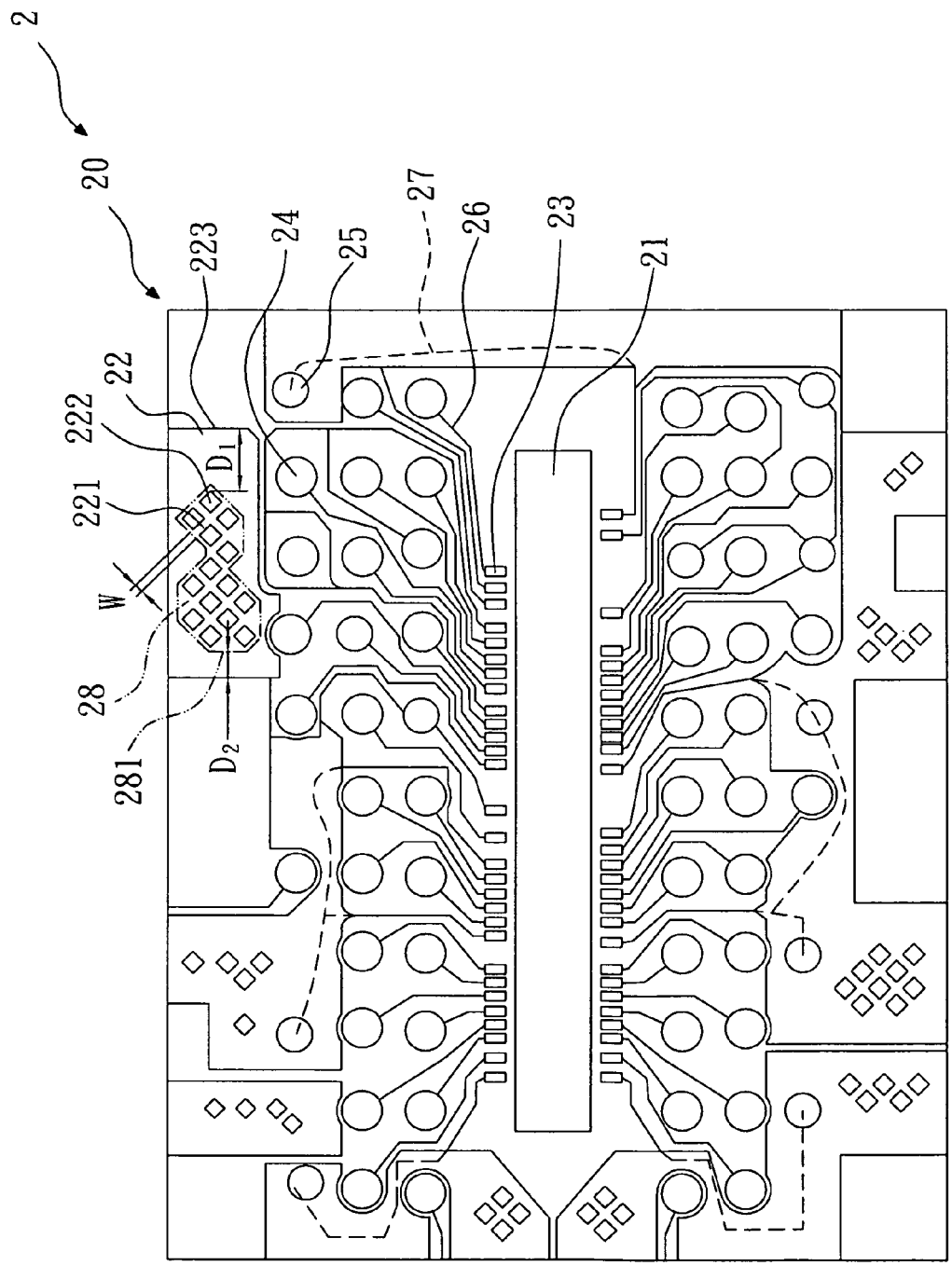
FIG. 2 is a top view of a circuit substrate having a plurality of power/ground planes with grid holes according to the present invention.

FIG. 2 shows a top view of a circuit substrate having a plurality of power/ground planes with grid holes according to the present invention. In the embodiment, the circuit substrate 2 is a substrate for window ball grid array (WBGA) package. It is understood that the circuit substrate 2 may be other types of circuit substrate. The circuit substrate 2 is, for example, a single-layered substrate or a multi-layered substrate. The circuit substrate 2 comprises a first conductive layer 20. The first conductive layer 20 comprises a window 21, a plurality of power/ground planes 22 and a layout. The layout comprises a plurality of fingers 23, a plurality of I/O ball pads 24, a plurality of power/ground ball pads 25 and a plurality of conductive traces 26. The fingers 23 are disposed at the periphery of the window 21.

The I/O ball pads 24 are electrically connected to some of the fingers 23 by some of the conductive traces 26. The power/ground ball pads 25 are disposed on the power/ground planes 22, and the power/ground planes 22 are electrically connected to the other fingers 23 by the other conductive traces 26. The fingers 23 are electrically connected to a chip (not shown), and a plurality of solder balls (not shown) are formed on the I/O ball pads 24 and the power/ground ball pads 25.

Each power/ground plane 22 has at least one plane edge 223 and a grid distribution area 28. The grid distribution area 28 has a plurality of grid lines 221 and a border 281. The grid lines 221 intersect each other to define a plurality of first grid holes 222. Preferably, the material of the power/ground planes 22 is copper, and the grid lines 221 and the first grid holes 222 are formed by etching a large area made of copper. Each grid line 221 has a width W, that is, the distance between two adjacent first grid holes 222 is W.

In the present invention, the distance D1 between the first grid hole 222 that is closest to the plane edge 223 and the plane edge 223 is more than 1.5 times the width W; in other words, if the width W is 100 µm, the distance D1 is 150 µm. Alternatively, the distance D2 between the border 281 of the grid distribution area 28 and the plane edge 223 of the power/ground planes 22 is more than 1.5 times the width W. Therefore, the circuit substrate 2 has a solid portion, which spans a distance of more than 1.5 times W measured from the plane edge 223 of the power/ground planes 22 inward, and the solid portion does not have any first grid holes. The principle of the design is to reserve the solid portion, which spans a distance of more than 1.5 times W inside the plane edge 223, for a return current path 27 of power signal and ground signal, and the return current path 27 does not have any first grid holes. Therefore, the influence on the resistance of power signal and ground signal caused by the first grid holes is reduced, power integrity is improved, and heat generation is reduced.

Preferably, the power/ground ball pads 25 are disposed on a position of the power/ground planes 22 that does not have the first grid holes.

Figure 3:
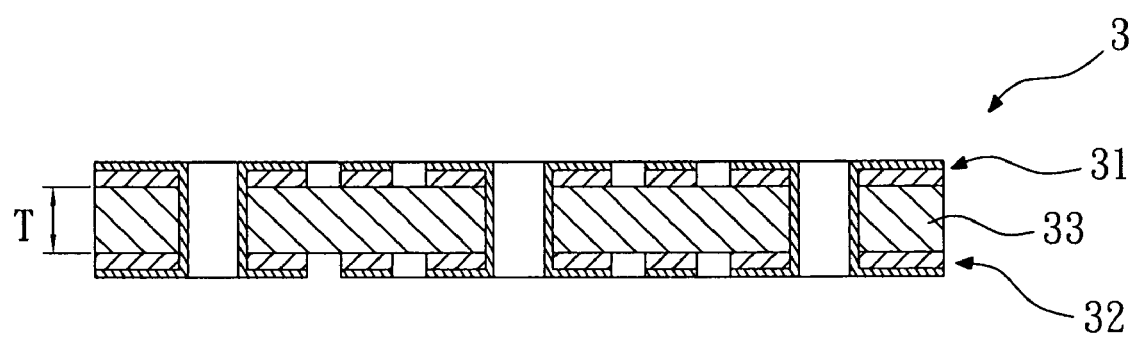
FIG. 3 is a cross-sectional view of the circuit substrate having a power/ground plane with grid holes according to the present invention.

FIG. 3 shows a cross-sectional view of the circuit substrate having a power/ground plane with grid holes according to the present invention. The circuit substrate 3 is a double-layered substrate, which comprises a first conductive layer 31, a second conductive layer 32 and a dielectric layer 33. The top view of the first conductive layer 31 is the same as that of the first conductive layer 20 in FIG. 2. The first conductive layer 31 has at least one power/ground plane 22 and a layout. The second conductive layer 32 is disposed under the first conductive layer 31. The dielectric layer 33 is disposed between the first conductive layer 31 and the second conductive layer 32, and has a thickness T.

In the first conductive layer 31, each power/ground plane 22 has at least one plane edge 223, and a grid distribution area 28. The grid distribution area 28 has a plurality of grid lines 221 and a border 281. The grid lines 221 intersect each other to define a plurality of first grid holes 222. Preferably, the material of the power/ground plane 22 is copper, and the grid lines 221 and the first grid holes 222 are formed by etching a large area made of copper. Each grid line 221 has a width W, that is, the distance between two adjacent first grid holes 222 is W. The distance D1 between the first grid hole 222 that is closest to the plane edge 223 and the plane edge 223 is more than 1.5 times the width W; in other words, if the width W is 100 μm, the distance D1 is 150 μm. Alternatively, the distance D2 between the border 281 of the grid distribution area 28 and the plane edge 223 of the power/ground plane 22 is more than 1.5 times the width W.

Figure 4:
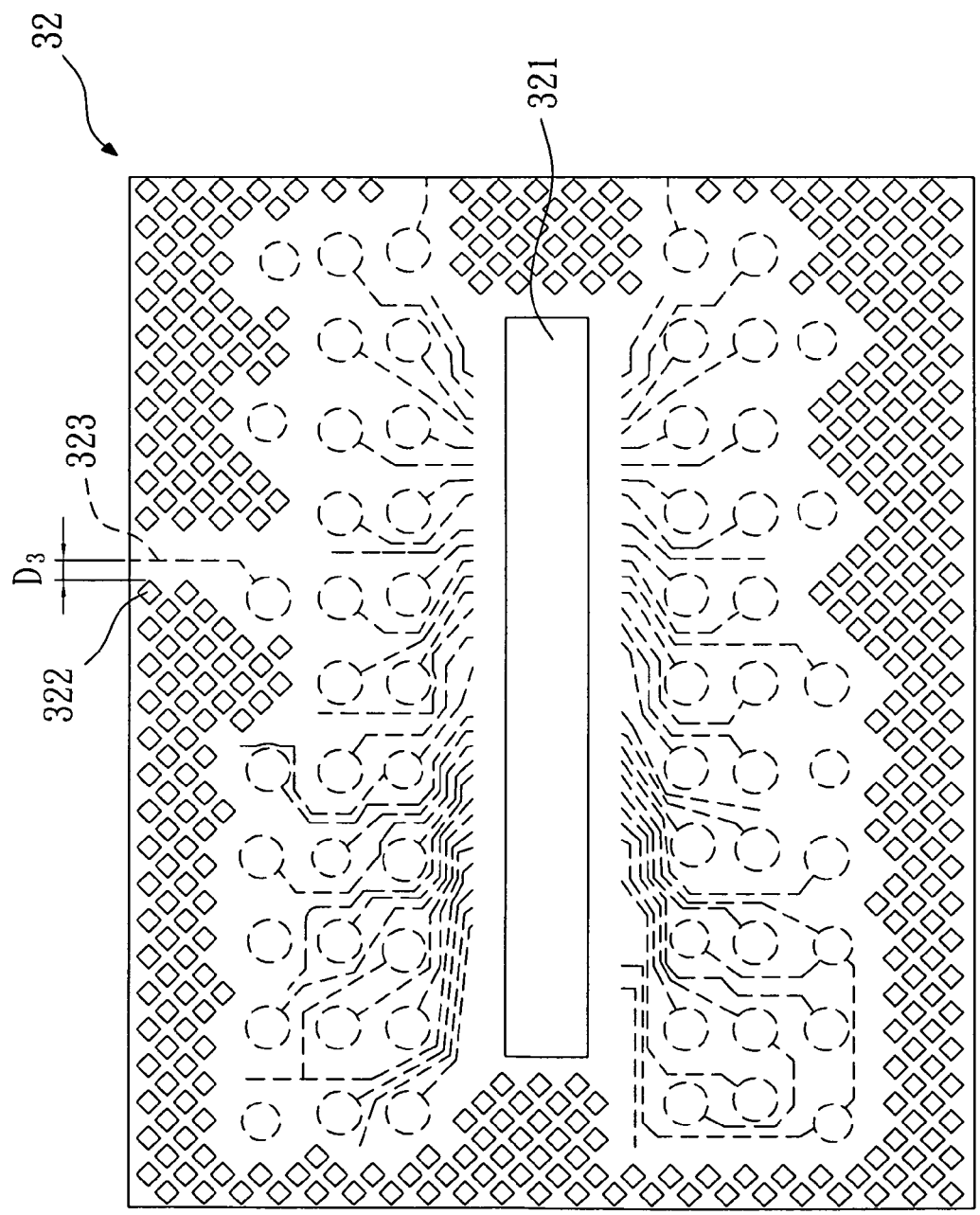
FIG. 4 is a top view of a second conductive layer of the circuit substrate in FIG. 3.

FIG. 4 shows a top view of the second conductive layer of the circuit substrate in FIG. 3. The second conductive layer 32 has a window 321, a plurality of second grid holes 322 and a projection layout 323. The position of the window 321 corresponds to the window 21 of the first conductive layer 20. Preferably, the second conductive layer 32 is a whole piece of copper foil, and the second grid holes 322 are formed by selectively etching the whole piece of copper foil. The projection layout 323 is a region formed by projecting the layout of the first conductive layer 20 onto the second conductive layer 32. In other words, the projection layout 323 is merely a region encompassed by the "mirror image" of the layout of the first conductive layer 20; it does not have an actual layout. The second grid holes 322 are disposed outside the projection layout 323, and the window 321 of the second conductive layer 32 corresponds to the window 21 of the first conductive layer 20. The distance D3 between the second grid hole 322 of the second conductive layer 32 that is closest to the projection layout 323 and the projection layout 323 is greater than the thickness T of the dielectric layer 33. Therefore, the second conductive layer 32 has a solid portion, which spans a distance of more than T measured from the edge of the projection layout 323 inward, and the solid portion does not have any second grid holes.

While several embodiments of the present invention have been illustrated and described, various modifications and improvements can be made by those skilled in the art. The embodiments of the present invention are therefore described in an illustrative but not restrictive sense. It is intended that the present invention should not be limited to the particular forms as illustrated, and that all modifications which maintain the spirit and scope of the present invention are within the scope defined in the appended claims.

What is claimed is:

1. A circuit substrate, having:
   a first conductive layer, comprising:
   at least one power/ground plane, having at least one plane edge and a plurality of grid lines, wherein each grid line has a width, the grid lines intersect each other to define a plurality of first grid holes, and the distance between the first grid hole that is closest to the plane edge and the plane edge is greater than 1.5 times the width, and
   a window;
   a second conductive layer, disposed under the first conductive layer and having a window, a plurality of second grid holes and a projection layout, wherein the projection layout is a region formed by projecting the layout of the first conductive layer onto the second conductive layer, the second grid holes are disposed outside the projection layout, and the window of the second conductive layer corresponds to the window of the first conductive layer; and
   a dielectric layer, disposed between the first conductive layer and the second conductive layer, and having a thickness, wherein the distance between the second grid hole of the second conductive layer that is closest to the projection layout and the projection layout is greater than the thickness of the dielectric layer.

2. The circuit substrate as claimed in claim 1, wherein the material of the power/ground plane is copper.

3. The circuit substrate as claimed in claim 1, wherein the first conductive layer further comprises a layout, and the layout comprises a plurality of fingers, a plurality of I/O ball pads, a plurality of power/ground ball pads and a plurality of conductive traces, wherein the I/O ball pads are electrically connected to some of the fingers by some of the conductive traces, the power/ground ball pads are disposed on the power/ground plane, and the power/ground plane are electrically connected to the other fingers by the other conductive traces.

4. The circuit substrate as claimed in claim 3, wherein the fingers are electrically connected to a chip, and a plurality of solder balls are formed on the I/O ball pads and the power/ground ball pads.

5. The circuit substrate as claimed in claim 3, wherein the power/ground ball pads are disposed on a position of the power/ground plane that does not have the first grid holes.

6. A circuit substrate, having:
   a first conductive layer, comprising:
   at least one power/ground plane, having at least one plane edge and a grid distribution area, wherein the grid distribution area has a plurality of grid lines and a border, each grid line has a width, the grid lines intersect each other to define a plurality of first grid holes, and the distance between the border of the grid distribution area and the plane edge of the power/ground plane is greater than 1.5 times the width, and
   a window;
   a second conductive layer, disposed under the first conductive layer and having a window, a plurality of second grid holes and a projection layout, wherein the projection layout is a region formed by projecting the layout of the first conductive layer onto the second conductive layer, the second grid holes are disposed outside the projection layout, and the window of the second conductive layer corresponds to the window of the first conductive layer; and
   a dielectric layer, disposed between the first conductive layer and the second conductive layer, and having a thickness, wherein the distance between the second grid hole of the second conductive layer that is closest to the projection layout and the projection layout is greater than the thickness of the dielectric layer.

7. The circuit substrate as claimed in claim 6, wherein the material of the power/ground plane is copper.

8. The circuit substrate as claimed in claim 6, wherein the first conductive layer further comprises a layout, and the layout comprises a plurality of fingers, a plurality of I/O ball pads, a plurality of power/ground ball pads and a plurality of conductive traces, wherein the I/O ball pads are electrically connected to some of the fingers by some of the conductive traces, the power/ground ball pads are disposed on the power/ground plane, and the power/ground plane are electrically connected to the other fingers by the other conductive traces.

9. The circuit substrate as claimed in claim 8, wherein the fingers are electrically connected to a chip, and a plurality of solder balls are formed on the I/O ball pads and the power/ground ball pads.

10. The circuit substrate as claimed in claim 8, wherein the power/ground ball pads are disposed on a position of the power/ground plane that does not have the first grid holes.

\* \* \* \* \*